United States Patent
Watanabe (10) Patent No.: US 10,553,560 B2
(45) Date of Patent: Feb. 4, 2020

(54) SEMICONDUCTOR DEVICE HAVING MULTIPLE SEMICONDUCTOR CHIPS LAMINATED TOGETHER AND ELECTRICALLY CONNECTED

(71) Applicant: PS4 Luxco S.a.r.l., Luxembourg (LU)

(72) Inventor: Mitsuhisa Watanabe, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 64 days.

(21) Appl. No.: 14/776,863

(22) PCT Filed: Mar. 18, 2014

(86) PCT No.: PCT/JP2014/057321
§ 371 (c)(1),
(2) Date: Sep. 15, 2015

(87) PCT Pub. No.: WO2014/148485
PCT Pub. Date: Sep. 25, 2014

(65) Prior Publication Data
US 2016/0035705 A1 Feb. 4, 2016

(30) Foreign Application Priority Data
Mar. 18, 2013 (JP) .................................. 2013-054901

(51) Int. Cl.
*H01L 25/065* (2006.01)
*H01L 23/00* (2006.01)
(Continued)

(52) U.S. Cl.
CPC ........ *H01L 25/0657* (2013.01); *H01L 23/481* (2013.01); *H01L 23/49838* (2013.01);
(Continued)

(58) Field of Classification Search
CPC ............. H01L 2924/00; H01L 2224/97; H01L 2224/73204; H01L 2224/32145;
(Continued)

(56) References Cited

U.S. PATENT DOCUMENTS

| | | | | |
|---|---|---|---|---|
| 2008/0142990 | A1* | 6/2008 | Yu | H01L 21/8221 257/777 |
| 2010/0171208 | A1* | 7/2010 | Fujii | H01L 23/3128 257/686 |
| 2010/0237481 | A1* | 9/2010 | Chi | H01L 23/3107 257/685 |
| 2010/0258931 | A1 | 10/2010 | Yoshida et al. | |
| 2011/0147945 | A1* | 6/2011 | Yoshida | H01L 21/561 257/774 |

(Continued)

FOREIGN PATENT DOCUMENTS

JP   2010251547   11/2010

OTHER PUBLICATIONS

Application No. PCT/JP2014/057321, International Search Report, dated Jun. 10, 2014.

*Primary Examiner* — David Chen
(74) *Attorney, Agent, or Firm* — Kunzler Bean & Adamson (57) ABSTRACT

A chip laminate in this semiconductor device has a structure consisting of a first semiconductor chip and a second semiconductor chip laminated together. The first semiconductor chip has a circuit-forming layer and a first bump electrode formed on one surface and a second bump electrode formed on the other surface. The second semiconductor chip has a circuit-forming layer and a third bump electrode formed on one surface and a fourth bump electrode formed on the other surface. The first semiconductor chip and the second semiconductor chip are laminated together such that the circuit-forming layer on the first semiconductor chip and the circuit-forming layer on the second semiconductor chip face each other and the first and third bump electrodes are electrically connected to each other.

16 Claims, 7 Drawing Sheets

(51) Int. Cl.
*H01L 23/48* (2006.01)
*H01L 23/498* (2006.01)
*H01L 25/00* (2006.01)

(52) U.S. Cl.
CPC .............. *H01L 24/17* (2013.01); *H01L 24/81* (2013.01); *H01L 24/97* (2013.01); *H01L 25/50* (2013.01); *H01L 2224/13025* (2013.01); *H01L 2224/1412* (2013.01); *H01L 2224/14181* (2013.01); *H01L 2224/16148* (2013.01); *H01L 2224/16227* (2013.01); *H01L 2224/81191* (2013.01); *H01L 2224/81193* (2013.01); *H01L 2225/06513* (2013.01); *H01L 2225/06517* (2013.01); *H01L 2225/06541* (2013.01); *H01L 2225/06555* (2013.01)

(58) Field of Classification Search
CPC . H01L 2224/16145; H01L 2225/06517; H01L 23/3128; H01L 23/481; H01L 24/97
USPC ......... 257/686, 774, 777, E23.011, E23.141, 257/E25.013
See application file for complete search history.

(56) References Cited

U.S. PATENT DOCUMENTS

| | | | |
|---|---|---|---|
| 2012/0098145 A1 | 4/2012 | Yoshida et al. | |
| 2012/0164788 A1* | 6/2012 | Ide | H01L 23/481 438/109 |
| 2012/0306074 A1 | 12/2012 | Kobayashi | |
| 2012/0319757 A1 | 12/2012 | Sato | |
| 2013/0122659 A1* | 5/2013 | Wu | H01L 25/0655 438/126 |
| 2013/0137216 A1* | 5/2013 | Ito | H01L 25/0652 438/108 |
| 2013/0214427 A1* | 8/2013 | Nakanoya | H01L 23/3135 257/774 |
| 2013/0217188 A1* | 8/2013 | Wang | H01L 21/563 438/118 |
| 2014/0084476 A1* | 3/2014 | Lin | H01L 23/48 257/774 |
| 2014/0291841 A1* | 10/2014 | Mitsuhashi | H01L 21/76877 257/737 |

* cited by examiner

SEMICONDUCTOR DEVICE HAVING MULTIPLE SEMICONDUCTOR CHIPS LAMINATED TOGETHER AND ELECTRICALLY CONNECTED

INDUSTRIAL FIELD

The present invention relates to a semiconductor device and a manufacturing method therefor.

BACKGROUND ART

Recently, with greater miniaturization and higher functionality of electronic devices, a chip on chip (CoC) semiconductor device has been provided in which a plurality of semiconductor chips having electrodes are laminated together.

As an example of a method of manufacturing such a semiconductor device, Patent Document 1 (Japanese Unexamined Patent Publication No. 2011-129684) has disclosed laminating together semiconductor chips having electrodes while connecting between bump electrodes to form a chip laminate, and mounting the chip laminate on one surface of a wiring board. An underfill material and a sealing resin layer are packed so as to cover between the laminated semiconductor chips and around the semiconductor chips so that stress does not break the connections between the electrodes of the semiconductor chips or crack the semiconductor chips themselves.

PATENT DOCUMENT

Patent Document 1: Japanese Unexamined Patent Publication No. 2011-129684

OUTLINE OF THE INVENTION

Problems that the Invention is to Solve

With the CoC semiconductor device disclosed by Patent Document 1, the chip laminate formed by laminating together a first semiconductor chip and a second semiconductor chip is mounted on one surface of a wiring board so that one surface on which a circuit-forming layer of the second semiconductor chip has been formed faces one surface of the wiring board. As an example, the first semiconductor chip is a memory chip and the second semiconductor chip is an interface (IF). During formation of the chip laminate, one surface of the second semiconductor chip on which the circuit-forming layer has been formed is suctioned and held by a bonding tool in order to laminate the opposite surface of the second semiconductor chip to the surface facing the wiring board—that is, the other surface on which a circuit-forming layer has not been formed—onto the other semiconductor chip. Because the bonding tool suctions and holds the one surface of the second semiconductor chip on which the circuit-forming layer has been formed, there is a risk of damaging the circuit-forming layer of the second semiconductor chip, that is, disconnecting the circuit in the circuit-forming layer, and reducing the reliability of the semiconductor device.

Means of Solving the Problems

The semiconductor device of the present invention for achieving the object described above includes a chip laminate formed by laminating together a first semiconductor chip and a second semiconductor chip. The first semiconductor chip has a substrate, a circuit-forming layer formed on one surface of the substrate, a first bump electrode formed on an electrode pad arranged on the circuit-forming layer, a second bump electrode formed on the other surface of the substrate, and a first through-electrode electrically connecting the first bump electrode to the second bump electrode. The second semiconductor chip has a substrate, a circuit-forming layer formed on one surface of the substrate, a third bump electrode formed on an electrode pad arranged on the circuit-forming layer, a fourth bump electrode formed on the other surface of the substrate, and a second through-electrode electrically connecting the third bump electrode to the fourth bump electrode. The first semiconductor chip and the second semiconductor chip are laminated together so that the circuit-forming layer of the first semiconductor chip faces the circuit-forming layer of the second semiconductor chip, and the first bump electrode is electrically connected to the third bump electrode.

Effects of the Invention

According to the present invention, the first semiconductor chip and the second semiconductor chip are laminated together so that the circuit-forming layer of the first semiconductor chip faces the circuit-forming layer of the second semiconductor chip. Therefore, during lamination of the first semiconductor chip and the second semiconductor chip, the other surface of the second semiconductor chip on which the circuit-forming layer has not been formed is held to first laminate the second semiconductor chip onto the semiconductor device. Because the one surface of the second semiconductor chip on which the circuit-forming layer has been formed is not held, there is little risk of damage to the circuit-forming layer of the second semiconductor chip.

EMBODIMENTS OF THE INVENTION

Embodiments of the present invention will be described in detail hereinafter with reference to the annexed drawings.

Figure 1:
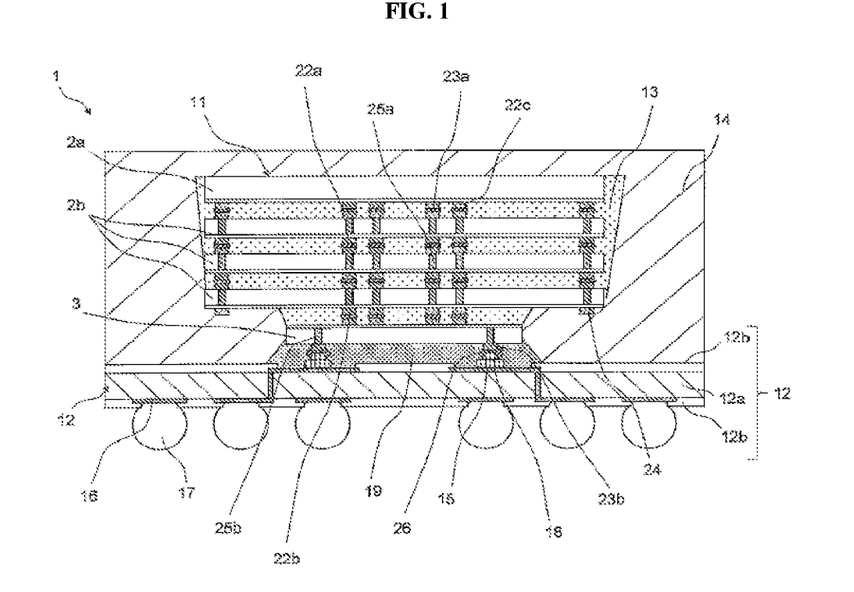
FIG. 1 is a sectional view showing the semiconductor device of an embodiment of the present invention.

FIG. 1 is a sectional view showing the CoC semiconductor device of the present invention.

A semiconductor device 1 has a structure in which an IF chip 3 (second semiconductor chip) is mounted on one surface of a wiring substrate 12, and three intermediate memory chips 2b (first semiconductor chips) and one topmost memory chip 2a (third semiconductor chip) are laminated together on one surface of the IF chip 3. The IF chip 3, the topmost memory chip 2a, and the intermediate memory chips 2b comprise a chip laminate 11. An underfill material 13 is packed into the gaps between the chips of the chip laminate 11. An adhesive member 19 is packed between the wiring substrate 12 and the IF chip 3. A sealing resin 14 covers around the chip laminate 11.

The structure of the semiconductor device 1 will be described in greater detail hereinafter.

The wiring substrate 12 has a rectangular insulating base material 12a (for example, a glass-epoxy substrate) having wirings (not shown) formed on both surfaces, and the wirings are covered by an insulating film 12b (for example, a solder resist film) except for connection pads 15 and lands 16 to be described later. A plurality of lands 16, for connecting to solder balls 17 which will become external terminals, are formed at a predetermined spacing on the other surface of the wiring substrate 12. Connection pads 15 on one surface are electrically connected to the lands 16 on the other surface by wirings formed inside the insulating base material 12a.

Figure 2:
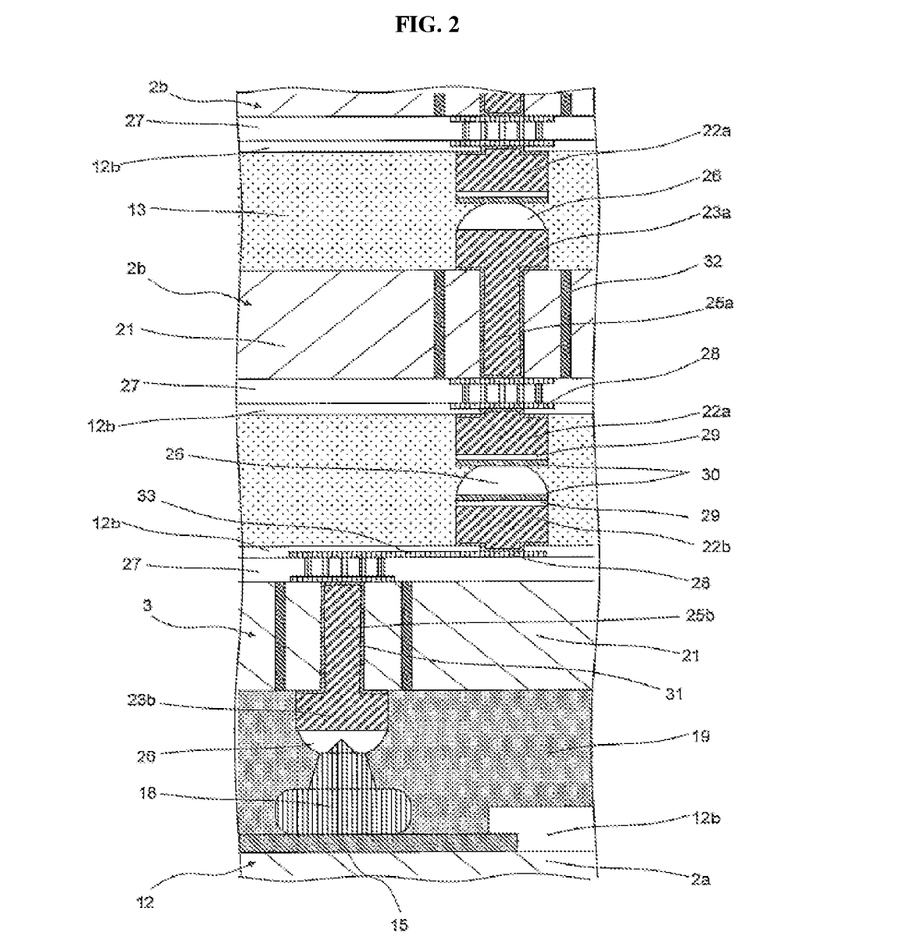
FIG. 2 is a magnified sectional view showing a connection between the bump electrodes of the semiconductor device shown in FIG. 1.

As shown in FIGS. 1 and 2, the chip laminate 11 is mounted on one surface of the wiring substrate 12 so that the connection pads 15 are electrically connected through wire bumps 18 to rear bump electrodes 23b (fourth bump electrodes) on the other surface of the IF chip 3 of the chip laminate 11. During this mounting, the chip laminate 11 is mounted on the wiring substrate 12 so that one surface of the wiring substrate 12 faces the other surface of the IF chip 3 on which the circuit-forming layer 27 has not been formed. The chip laminate 11 has a structure in which one IF chip 3, three intermediate memory chips 2b, and one topmost memory chip 2a are laminated together in this order on the wiring substrate 12. An intermediate memory chip 2b is laminated onto the IF chip 3 so that a circuit-forming layer 27 on one surface of the IF chip 3 faces a circuit-forming layer 27 on one surface of the intermediate memory chip 2b, and surface bump electrodes 22a (first bump electrodes) on one surface of the intermediate memory chip 2b are connected to surface bump electrodes 22b (third bump electrodes) on one surface of the IF chip 3. Two intermediate memory chips 2b are laminated together so that surface bump electrodes 22a on one surface of the second intermediate memory chips 2b are connected to rear bump electrodes 23a (second bump electrodes) on the other surface of the first intermediate memory chip 2b. The third intermediate memory chip 2b is laminated in the same manner as the second intermediate memory chip 2b. The third intermediate memory chip 2b and the topmost memory chip 2a are laminated together so that the other surface of the third intermediate memory chips 2b on which the circuit-forming layer 27 has not been formed faces one surface of the topmost memory chip 2a on which the circuit-forming layer 27 has been formed, and rear bump electrodes 22c (fifth bump electrodes) on one surface of the topmost memory chip 2a are connected to the rear bump electrode 23a on the other surface of the third intermediate memory chip 2b.

The thickness of the topmost memory chip 2a seen in the chip lamination direction is thicker than the thickness of the intermediate memory chips 2b to increase rigidity against stress occurring inside the chip laminate 11 as will be described later. As an example, the thickness of the topmost memory chip 2a is 100 μm, and the thickness of the intermediate memory chips 2b and the IF chip 3 is 50 μm. Although the chip laminate 11 comprises five chips in the present embodiment, the chip laminate 11 may comprise four or less or six or more chips.

The underfill material 13, comprising an epoxy-based resin or the like, is packed between and around the laminated chips in the chip laminate 11. The adhesive member 19, such as non-conductive paste (NCP), is packed between the wiring substrate 12 and the IF chip 3 of the chip laminate 11. The sealing resin 14 is formed so as to cover the periphery of the chip laminate 11 mounted on one surface of the wiring substrate 12. The sealing resin 14 is formed in the same range as the wiring substrate 12 seen in plan view.

Figure 3A:
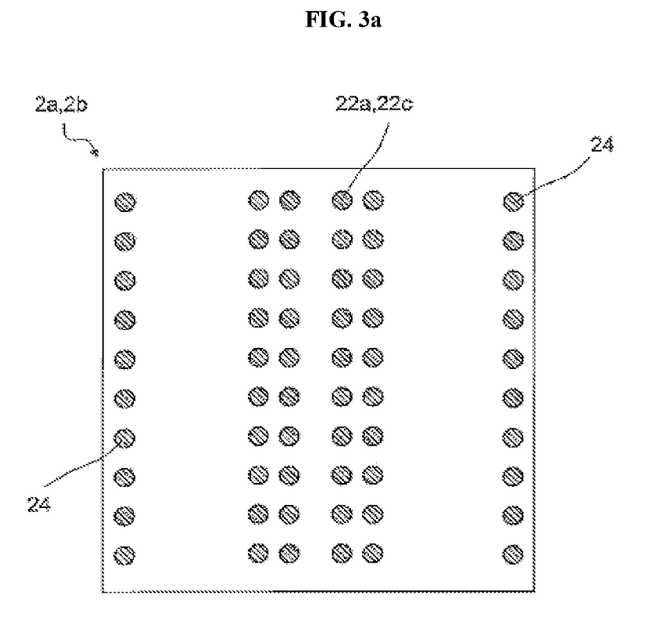
FIG. 3a is a plan view showing one surface of a memory chip.

FIG. 3a is a plan view showing one of the memory chips 2a and 2b constituting the chip laminate 11. The memory chip 2a or 2b comprises a rectangular silicon substrate 21, and the circuit-forming layer 27 and the insulating film 12b (see FIG. 2) are disposed over one entire surface of the silicon substrate 21. In a central region of one surface of the silicon substrate 21, a plurality of surface bump electrodes 22a and 22c are located on an electrode pad 28 arranged on the circuit-forming layer 27, and formed so as to form rows parallel to one side of the silicon substrate 21. A plurality of reinforcing bump electrodes 24 are formed along two sides of the silicon substrate 21 so as to form rows parallel to the rows of the surface bump electrodes 22a and 22c. These reinforcing bump electrodes 24 reinforce the bump electrodes, or are connected to a power source or a ground (GND) to reinforce the power source or GND. As shown in FIG. 2, the surface bump electrodes 22a and 22b are formed as cylinders comprising Cu, for example, and are disposed so as to protrude from one surface of the silicon substrate 21. A Ni plating layer 29 for preventing diffusion of Cu and an Au plating layer 30 for preventing oxidation are formed on the surface bump electrodes 22a and 22b.

The intermediate memory chip 2b has a through-electrode 25a penetrating from the surface bump electrode 22a on one surface toward the other surface. On the other surface of the intermediate memory chip 2b from the silicon substrate 21, a plurality of rear bump electrodes 23a are formed forming a row in locations corresponding to the surface bump electrodes 22*a* on the one surface. The rear bump electrodes 23*a* are electrically connected to the through-electrode 25*a* exposed on the other surface. That is, the through-electrode 25*a* of the intermediate memory chip 2*b* and the rear bump electrodes 23*a* are arranged in locations overlapping the surface bump electrodes 22*a* seen in plan view. The rear bump electrodes 23*a* are cylinders comprising Cu, for example, and are disposed so as to protrude from the other surface of the silicon substrate 21. A conductive solder layer 26 comprising Sn/Ag solder, for example, is disposed on the surface of the rear bump electrodes 23*a* of the intermediate memory chip 2*b*. As on the one surface, a plurality of reinforcing bump electrodes 24 are formed along two sides of the silicon substrate 21 so as to form a row parallel to the rows of the surface bump electrodes 22*a*. The reinforcing bump electrodes 24 on the other surface are connected through the through-electrode 25*a* to the reinforcing bump electrodes 24 on the one surface.

Rear bump electrodes and reinforcing bump electrodes are disposed on the other surface of the topmost memory chip 2*a* as shown in FIG. 1. To increase the rigidity of the chip, no through-electrode is disposed.

Figure 3B:
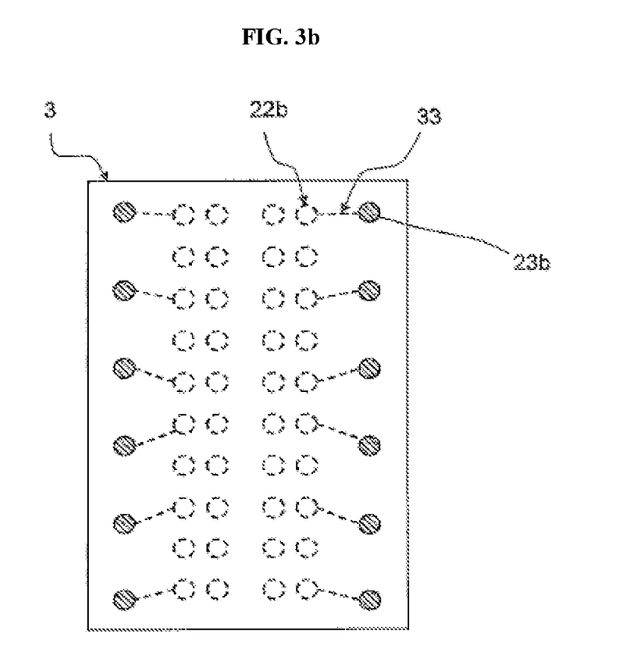
FIG. 3b is a bottom view showing the other surface of an IF chip.

FIG. 3*b* is a bottom view showing the other surface of the IF chip 3 constituting the chip laminate 11. The IF chip 3 comprises a rectangular silicon substrate 21 which is smaller in plan view than the memory chips 2*a* and 2*b*, and the circuit-forming layer 27 and the insulating film 12*b* (see FIG. 2) are disposed over one entire surface of the silicon substrate 21. On one surface of the silicon substrate 21, a plurality of surface bump electrodes 22*b* are formed on an electrode pad arranged on the circuit-forming layer 27 in locations corresponding to the locations where the surface bump electrodes 22*a* and 22*c* are disposed on one surface of the memory chips 2*a* and 2*b*. On the other surface of the silicon substrate 21, a plurality of rear bump electrodes 23*b* are formed so as to form a row parallel to one side of the silicon substrate in locations inclined toward the edges of the silicon substrate 21 compared to the locations where the surface bump electrodes 22*a* and 22*c* are disposed on one surface of the memory chips 2*a* and 2*b*. The rear bump electrodes 23*b* of the IF chip 3 are fewer than the rear bump electrodes 22*b*, and the spacing between rear bump electrodes 23*b* within the row of rear bump electrodes 22*b* is wider than the spacing between the surface bump electrodes 22*b* within the row of surface bump electrodes 22*b*.

The IF chip 3 has through-electrodes 25*b* formed in a row penetrating from the surface bump electrode 22*b* on the other surface toward the one surface. The rear bump electrodes 22*b* formed on one surface are electrically connected by re-wirings 33 to the corresponding through-electrode 25*b* exposed on one surface of the IF chip 3. The number of through-electrodes 25*b* in the IF chip 3 is equal to the number of rear bump electrodes 23*b*, and fewer than the number of surface bump electrodes 22*b*. The through-electrodes 25*b* and the rear bump electrodes 23*b* of the IF chip 3 are arranged in locations which do not overlap the surface bump electrodes 22*b* seen in plan view. The spacing between through-electrodes 25*b* within the row of through-electrodes 25*b* in the IF chip 3 is wider than the spacing between through-electrodes 25*a* within the row of through-electrodes 25*a* in the intermediate memory chip 2*b*. As an example, the spacing between the through-electrodes 25*b* in the IF chip 3 is 200 µm or greater.

Usually, a high ambient temperature of the CoC semiconductor device 1 swells the through-electrodes 25 linking the electrodes disposed on one surface of the chips to the electrode disposed on the other surface, which concentrates stress on the topmost and bottommost chips of the chip laminate 11. The CoC semiconductor device 1 has had the problem that if the IF chip 3 located in the bottommost layer has a narrow spacing between the through-electrodes 25*b* disposed in the IF chip 3, the resulting stress tends to crack the chip.

As a countermeasure in the present embodiment, the number of through-electrodes 25*b* in the IF chip 3 is fewer and the spacing between the through-electrodes 25*b* within the row is wider to increase the rigidity of the IF chip 3 against stress occurring inside the semiconductor device 1, which lowers the risk of cracks occurring between the through-electrodes 25*b*. Therefore, the reliability of the semiconductor device 1 is improved. In addition, the circuit-forming layer 27 of the IF chip 3 is arranged so as not to face one surface of the wiring substrate 12, which minimizes generation of a parasitic capacitance.

Next, a process for manufacturing the semiconductor device 1 having the structure described earlier will be described with reference to FIGS. 4*a*-6*e*.

Figure 4A:
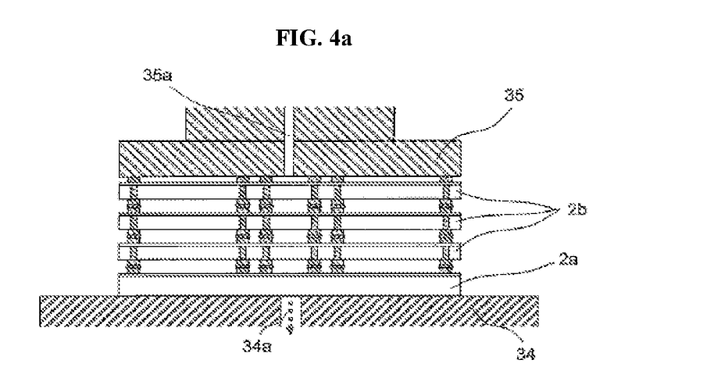
FIG. 4a is a plan view showing a process for laminating together a plurality of memory chips and IF chips to form a chip laminate.

First, to form the chip laminate 11, as shown in FIG. 4*a*, the topmost memory chip 2*a* is arranged on a bonding stage 34 having a suction hole 34*a* so as to contact the other surface of the topmost memory chip 2*a* on which the circuit-forming layer 27 has not been formed. The topmost memory chip 2*a* arranged in this way is held by the bonding stage 34 by a negative pressure generated by the suction hole 34*a*.

An intermediate memory chip 2*b* is held by a bonding tool 35 by a negative pressure generated by a suction hole 35*a* in the bonding tool 35, and the bonding tool 35 moves the intermediate memory chip 2*b* to just above the bonding stage 34. During this moving, the bonding tool 35 does not contact the one surface of the intermediate memory chip 2*b* on which the circuit-forming layer 27 has not been formed, and the bonding tool 35 contracts the surface bump electrodes 22*a*. The intermediate memory chip 2*b* and the topmost memory chip 2*a* are then laminated together so that the surface bump electrodes 22*c* on the topmost memory chip 2*a* do not contact the rear bump electrodes 23*a* on the intermediate memory chip 2*b*. During this lamination, the intermediate memory chip 2*b* and the topmost memory chip 2*a* are laminated together so that the other surface of the intermediate memory chip 2*b* on which the circuit-forming layer 27 has not been formed faces one surface of the topmost memory chip 2*a* on which the circuit-forming layer 27 has been formed. The second and third intermediate memory chips 2*b* are laminated onto the first intermediate memory chip 2*b* by the same procedure.

Figure 4B:
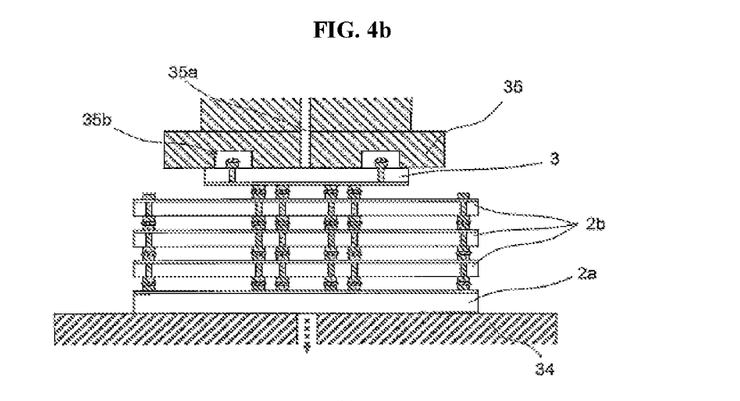
FIG. 4b is a plan view showing a process for laminating together a plurality of memory chips and IF chips to form a chip laminate.
Figure 5:
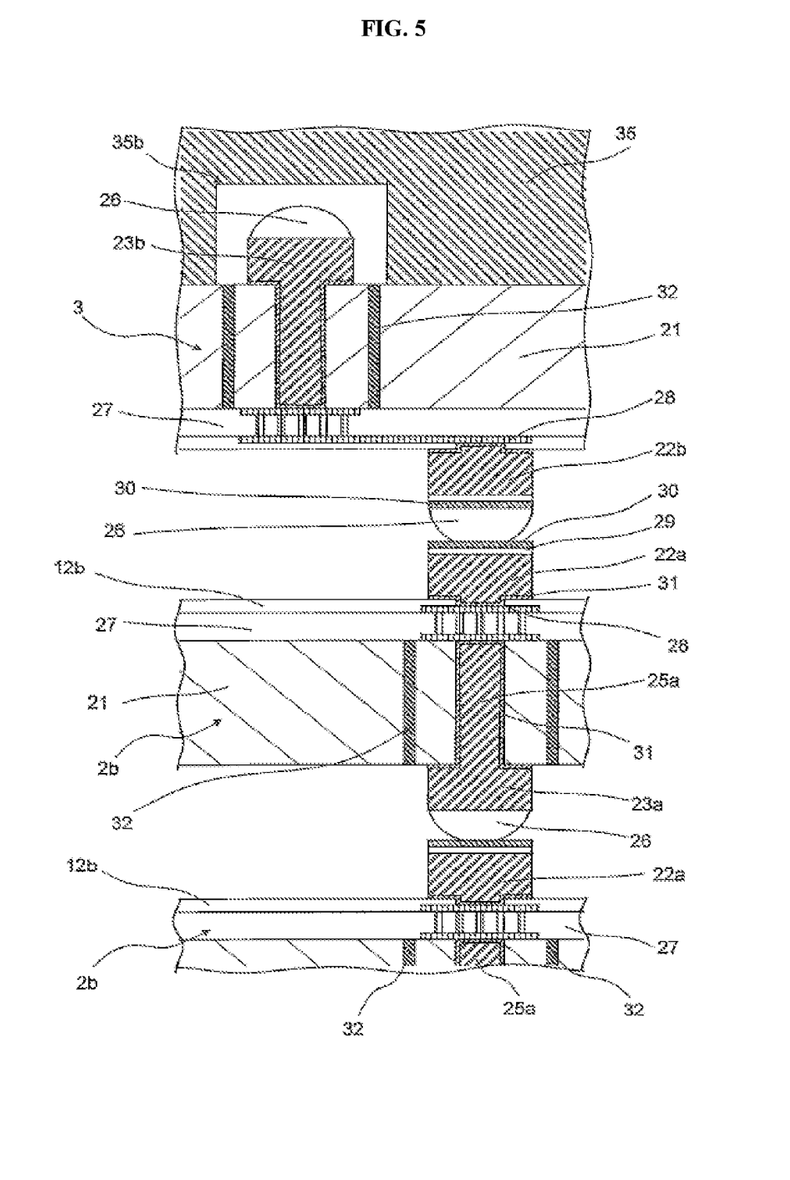
FIG. 5 is a magnified view showing a connection between the bump electrodes of the semiconductor device shown in FIG. 1 when an IF chip is laminated onto a memory chip.

Next, the IF chip 3 is laminated as shown in FIG. 4*b*. The IF chip 3 is held by another bonding tool 35 by the negative pressure generated by the suction hole 35*a*, and the bonding tool 35 moves the IF chip 3 to just above the bonding stage 34. Because the surface bump electrodes 22*b* of the IF chip 3 are kept in a bump clearance groove 35*b* of another bonding tool 35 during this procedure as shown in FIG. 5, the other bonding tool 35 contacts the other surface of the IF chip 3 on which the circuit-forming layer 27 has not been formed. The IF chip 3 is then laminated onto the third intermediate memory chip 2*b* so that the circuit-forming layer 27 on the one surface of the IF chip 3 faces the circuit-forming layer 27 on the one surface of the third intermediate memory chip 2*b*, and the surface bump electrodes 22*a* of the intermediate memory chip 2*b* are connected to the surface bump electrodes 22*b* of the IF chip 3. Once the chips have been laminated together in this way, the solder layer 26 of each of the chips is hardened. Thus, a plurality of chips are laminated to form the chip laminate 11.

Figure 4C:
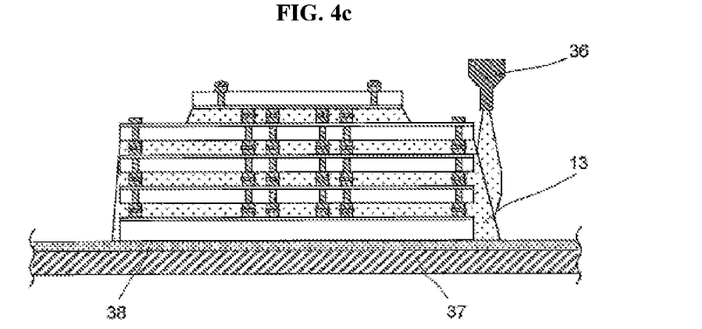
FIG. 4c is a plan view showing a process for laminating together a plurality of memory chips and IF chips to form a chip laminate.
Figure 4D:
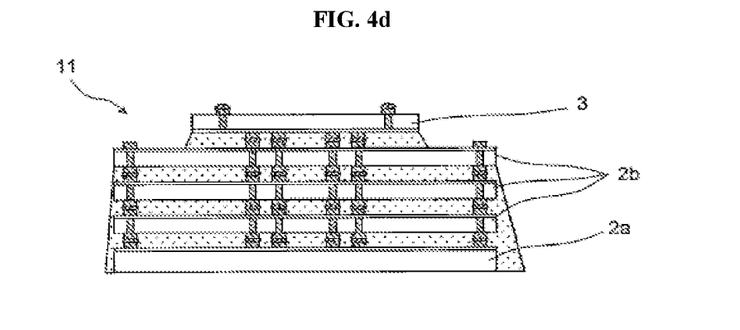
FIG. 4d is a plan view showing a process for laminating together a plurality of memory chips and IF chips to form a chip laminate.

As shown in FIG. 4c, the formed chip laminate 11 is arranged on a coating stage 37, one surface of which is covered by a coating sheet 38. The underfill material 13 is then packed into the gaps of the chip laminate 11 by a dispenser 36. A material having little wettability of the underfill material, such as a fluorine-based sheet or a sheet coated with a silicon-based adhesive, may be used as the coating sheet 38. Subsequently, the entire chip laminate 11 is heat-treated at a predetermined temperature, such as about 150° C., to cure the underfill material while removing the chip laminate from the coating stage 37. Thus, the chip laminate 11 is formed packed with the underfill material 13 as shown in FIG. 4d. Because a sheet comprising a material having little wettability of the underfill material was used as the coating sheet 38 in the present embodiment, the underfill material 13 resisted adhering to the coating sheet 38 during curing of the underfill material 13.

Figure 6A:
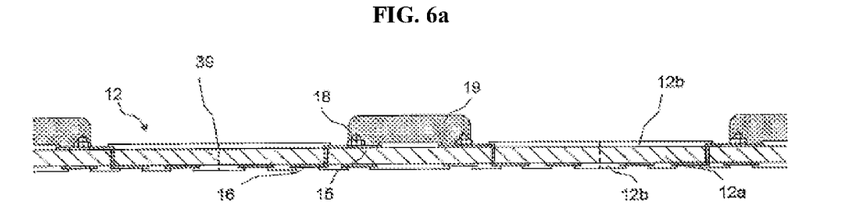
FIG. 6a is a sectional view showing a process for forming a semiconductor device.

Next, the wiring substrate 12 is prepared as shown in FIG. 6a. The insulating base material 12a (for example, a glass-epoxy substrate) having wirings (not shown) formed on both surfaces is used as the wiring substrate 12. A plurality of connection pads 15 are formed on one surface of the insulating base material 12a together with wire bumps 18 disposed on the surface of the connection pads 15 for connecting to the IF chip 3. A plurality of lands 16 connected to solder balls 17 which will become external terminals are formed at a predetermined spacing in a lattice shape, for example, on the other surface of the insulating base material 12a. The plurality of connection pads 15 are electrically connected to the plurality of lands 16 by wirings passing through the insulating base material 12a. Except for the connection pads 15 and the lands 16, the wirings on both surfaces of the insulating base material 12a are covered by the insulating film 12b such as a solder resist film. The wiring substrate 12 is divided by dicing lines 39 into regions comprising semiconductor devices 1.

Figure 6B:
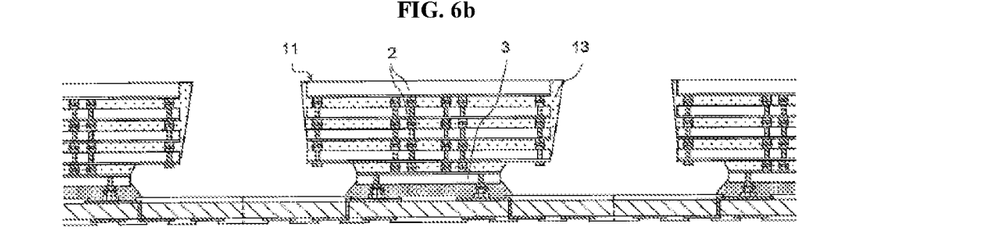
FIG. 6b is a sectional view showing a process for forming a semiconductor device.

An uncured adhesive member 19, such as NCP, is coated on one surface of the wiring substrate 12 so as to cover the connection pads 15 and the wire bumps 18. Before the coated adhesive member 19 is cured, as shown in FIG. 6b, the chip laminate 11 is laminated to the wiring substrate 12 so that one surface of the wiring substrate 12 faces the other surface of the IF chip 3 of the chip laminate 11 on which the circuit-forming layer 27 has not been formed. During this lamination, the wire bumps 18 on the wiring substrate 12 are connected through the solder layer 26 to the surface bump electrodes 22b of the IF chip 3 of the chip laminate 11. Mounting the chip laminate 11 on one surface of the wiring substrate 12 in this way arranges the topmost memory chip 2a in the chip laminate 11 in the location most distant from the wiring substrate 12.

After the chip laminate 11 has been mounted on the wiring substrate 12, the wiring substrate 12 is set in a metal mold comprising an upper die and a lower die in a transfer mold apparatus (not shown) in order to cover the chip laminate 11 by the sealing resin 14. A cavity (not shown) for collectively covering the plurality of chips is formed in the upper die of the metal mold, and the chip laminate 11 is loaded into this cavity. Subsequently, the heated and melted sealing resin 14 is injected into the cavity, and the chip laminate 11 inside the cavity is covered with the sealing resin 14. A thermosetting resin such as an epoxy resin is used as the sealing resin 14.

Figure 6C:
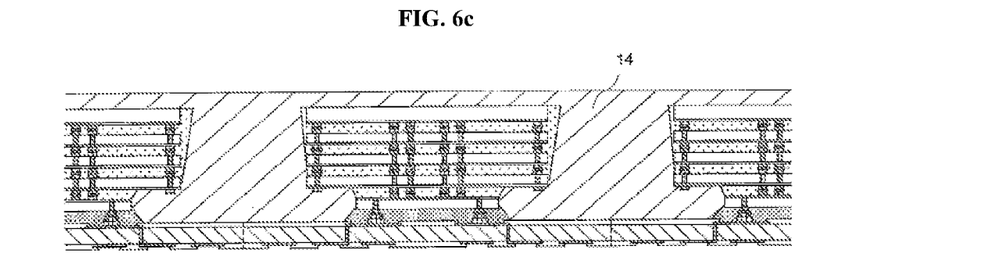
FIG. 6c is a sectional view showing a process for forming a semiconductor device.

Next, the sealing resin 14 is cured at a predetermined temperature (for example, about 180° C.) while the sealing resin 14 is packed inside the cavity. Thus, the sealing resin 14 is formed covering the chip laminate 11 mounted on one surface of the wiring substrate 12 as shown in FIG. 6c, and the sealing resin 14 is cured by baking the sealing resin 14 at a predetermined temperature. Forming the sealing resin 14 after packing the underfill material 13 and the adhesive member 19 into the gaps between the chips in the present embodiment minimizes voids caused by air left in the gaps between the chips.

Figure 6D:
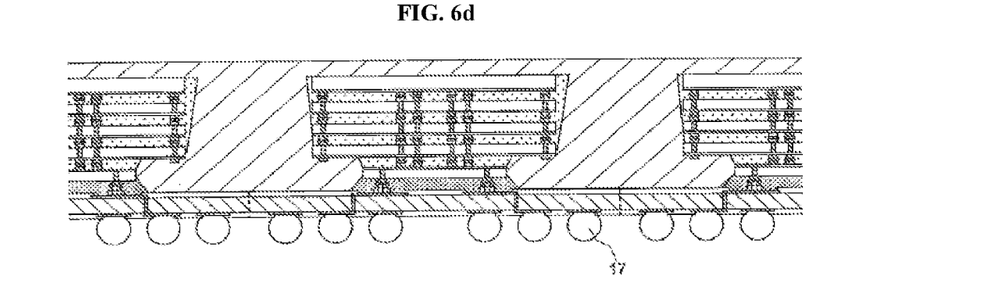
FIG. 6d is a sectional view showing a process for forming a semiconductor device.
Figure 6E:
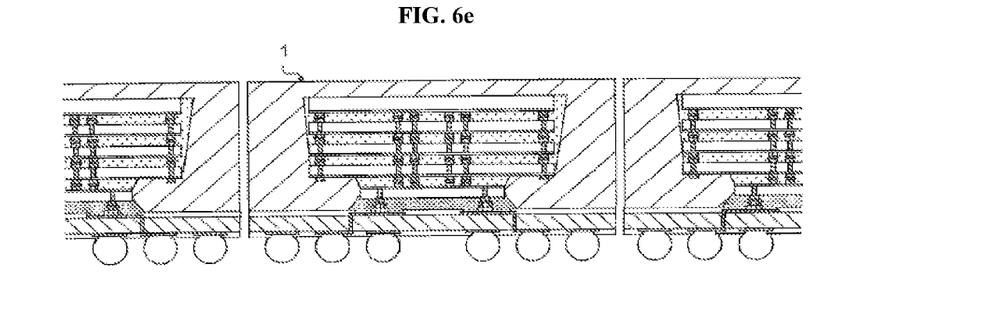
FIG. 6e is a sectional view showing a process for forming a semiconductor device.

After the sealing resin 14 has been formed on one surface of the wiring substrate 12, conductive metal balls which will become the external terminals of the semiconductor device 1, such as the solder balls 17, are connected to the lands 16 formed on the other surface of the wiring substrate 12 as shown in FIG. 6d. The plurality of solder balls 17 may be adsorbed and held by a mount tool (not shown) provided with a plurality of adsorption holes formed so as to match the locations of the lands 16 on the wiring substrate 12, and mounted collectively on the lands 16. Next, the entire wiring substrate 12 is reflow-soldered to connect the solder balls 17 to the lands 16. After the solder balls 17 have been connected to the lands 16, the wiring substrate 12 is cut apart along predetermined dicing lines 39 to form a plurality of CoC semiconductor devices 1 as shown in FIG. 6e.

According to this manufacturing method, as shown in FIG. 4b, the other surface of the IF chip 3 on which the circuit-forming layer 27 is not formed is held by the bonding tool 35 when the IF chip 3 is laminated to the intermediate memory chips 2b. As a result, because the circuit-forming layer 27 does not contact the bonding tool 35, there is little risk of damage to the circuit-forming layer 27 of the IF chip 3. Therefore, there is little risk of disconnecting the circuit formed on the circuit-forming layer 27, and the reliability of the semiconductor device 1 is improved.

FIGS. 7a-7d are sectional views showing a variant example of the process for forming the chip laminate 11 of the semiconductor device 1 described earlier.

Figure 7A:
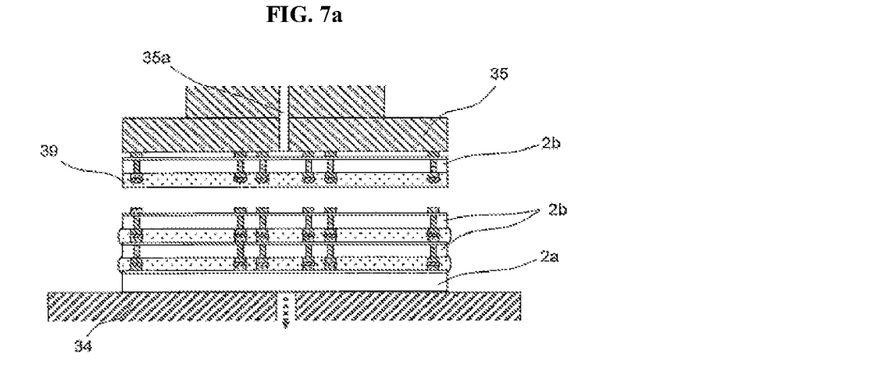
FIG. 7a is a sectional view showing a variant example of a process for laminating together a plurality of memory chips and IF chips to form a chip laminate.
Figure 7B:
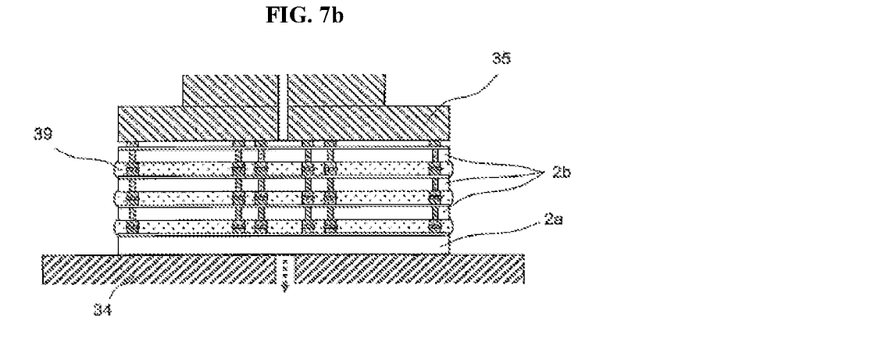
FIG. 7b is a sectional view showing a variant example of a process for laminating together a plurality of memory chips and IF chips to form a chip laminate.
Figure 7C:
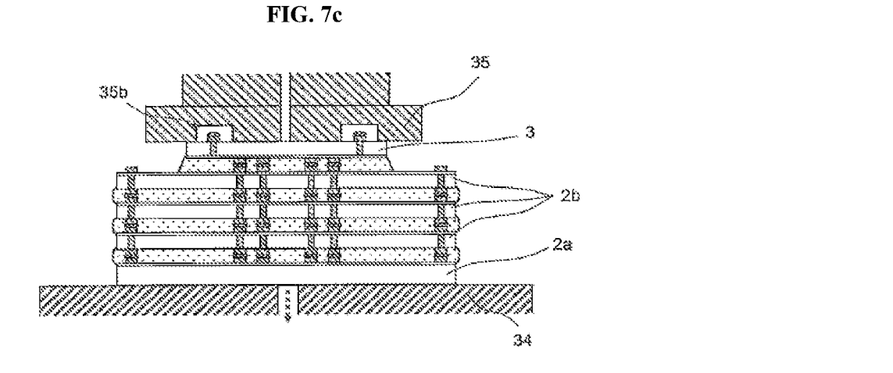
FIG. 7c is a sectional view showing a variant example of a process for laminating together a plurality of memory chips and IF chips to form a chip laminate.

In this variant example, as shown in FIGS. 7a and 7b, the other surface of the intermediate memory chip 2b on which the non-conductive film (NCF) was disposed is laminated onto the topmost memory chip 2a. Similarly, as shown in FIG. 7c, the one surface of the IF chip 3 on which the NCF was disposed is laminated onto the third intermediate memory chip 2b. The NCF is a resin such as an epoxy-based film, and contains a flux active material for making a good connection between bump electrodes when the chips are joined. Examples of flux active materials are organic acids and amines. Because the NCF contains a flux active material, the bump electrodes are connected well to each other even if the chips are connected after disposing the NCF so as to cover the bump electrodes of the chips.

Figure 7D:
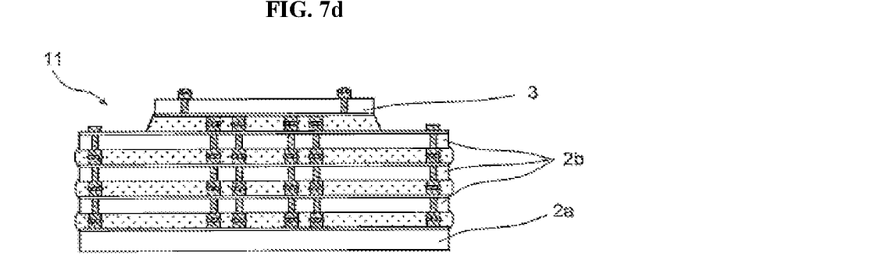
FIG. 7d is a sectional view showing a variant example of a process for laminating together a plurality of memory chips and IF chips to form a chip laminate.

As shown in FIG. 7d, because NCF has already been packed between the chips, there is no need to pack the underfill material 13 into the chip laminate 11 formed in this way. Therefore, omitting a process for packing the underfill material 13 improves manufacturing efficiency and lowers the manufacturing cost of the semiconductor device 1.

Although preferred embodiments of the present invention have been described, the present invention is not to be taken as limited to these embodiments, and various modifications may be possible without departing from the scope of the present invention. For example, although chip laminates comprising four memory chips and one IF chip were described earlier in the embodiments, the present invention can be applied so long as a structure has a plurality of semiconductor chips laminated together, such as a laminate of a memory chip and a logic chip.

What is claimed is:

1. A semiconductor device comprising:
a first semiconductor chip having a substrate, a circuit-forming layer formed on one surface of the substrate, first bump electrodes formed on an electrode pad arranged on the circuit-forming layer, second bump electrodes formed on the other surface of the substrate, and first through-electrodes electrically connecting the first bump electrodes to the second bump electrodes; and
a second semiconductor chip having a substrate comprising a first surface and a second surface, the second surface being opposite to the first surface, a circuit-forming layer formed on the first surface of the substrate, third bump electrodes formed on an electrode pad arranged on the circuit-forming layer, fourth bump electrodes formed on the second surface of the substrate, and second through-electrodes electrically connecting the third bump electrodes to the fourth bump electrodes, wherein a number of the fourth bump electrodes is fewer than a number of the third bump electrodes, and a number of the second through-electrodes is fewer than a number of the first through-electrodes; and including:
a chip laminate having the first semiconductor chip and the second semiconductor chip laminated together so that the one surface of the first semiconductor chip faces the first surface of the second semiconductor chip;
the first semiconductor chip having a plurality of first reinforcing bump electrodes formed on the one surface of the substrate, a plurality of second reinforcing bump electrodes formed on the other surface of the substrate, the plurality of second reinforcing bump electrodes being arranged in locations overlapping the respective first reinforcing bump electrodes;
wherein the first and second reinforcing bump electrodes are disposed outside the periphery of the second semiconductor chip as seen in plan view.

2. The semiconductor device as claimed in claim 1, comprising a wiring substrate having a connection pad formed on one surface, and the chip laminate is mounted on the one surface of the wiring substrate so that the one surface of the wiring substrate faces the second surface of the second semiconductor chip, and the connection pad is electrically connected to the fourth bump electrodes.

3. The semiconductor device as claimed in claim 1, wherein the first reinforcing bump electrodes are arranged in a row direction along one side of the first semiconductor chip; and a first spacing between the fourth bump electrodes in the row direction is wider than a second spacing between the third bump electrodes in the row direction.

4. The semiconductor device as claimed in claim 1, wherein:
the first through-electrodes and the second bump electrodes of the first semiconductor chip are arranged in locations overlapping the first bump electrodes as seen in plan view; and
the second through-electrodes and the fourth bump electrodes of the second semiconductor chip are arranged in locations not overlapping the third bump electrodes as seen in plan view.

5. The semiconductor device of claim 3, wherein no third bump electrode is disposed between the fourth bump electrodes and a respective side of the second semiconductor chip as seen in plan view.

6. The semiconductor device of claim 3, wherein the fourth bump electrodes are disposed along opposite sides of the second semiconductor chip, and wherein no third bump electrode is disposed between the fourth bump electrodes and a respective side of the second semiconductor chip as seen in plan view.

7. The semiconductor device of claim 1, further comprising a plurality of reinforcing through-electrodes in the first semiconductor chip, the plurality of reinforcing through-electrodes respectively connecting first reinforcing bump electrodes with second reinforcing bump electrodes.

8. The semiconductor device of claim 1, wherein the first reinforcing bump electrodes are arranged in a row direction along opposite sides of the first semiconductor chip.

9. A semiconductor device comprising:
a first semiconductor chip having a substrate, a circuit-forming layer formed on one surface of the substrate, first bump electrodes formed on an electrode pad arranged on the circuit-forming layer, second bump electrodes formed on the other surface of the substrate, and first through-electrodes electrically connecting the first bump electrodes to the second bump electrodes;
a second semiconductor chip having a substrate comprising a first surface and a second surface, the second surface being opposite the first surface, a circuit-forming layer formed on the first surface of the substrate, third bump electrodes formed on an electrode pad arranged on the circuit-forming layer, fourth bump electrodes formed on the second surface of the substrate, and second through-electrodes electrically connecting the third bump electrodes to the fourth bump electrodes, wherein a number of the fourth bump electrodes is fewer than a number of the third bump electrodes, and a number of the second through-electrodes is fewer than a number of the first through-electrodes;
a third semiconductor chip having a substrate, a circuit-forming layer formed on one surface of the substrate, and fifth bump electrodes formed on an electrode pad arranged on the circuit-forming layer;
a wiring substrate comprising an insulating base material and having a connection pad formed on one surface; and
a chip laminate formed by laminating together the first semiconductor chip and the second semiconductor chip so that the one surface of the first semiconductor chip faces the first surface of the second semiconductor chip, and the first bump electrodes are electrically connected to the third bump electrodes such that the first bump electrodes contact the third bump electrodes via a conductive solder layer, and the third semiconductor chip is laminated to the first semiconductor chip so that the other surface of the first semiconductor chip faces the circuit-forming layer of the third semiconductor chip, and the second bump electrodes are electrically connected to the fifth bump electrodes;
wherein the chip laminate is mounted on the one surface of the wiring substrate so that the one surface of the wiring substrate faces the second surface of the second semiconductor chip;
the first semiconductor chip having a plurality of first reinforcing bump electrodes formed on the one surface of the substrate, a plurality of second reinforcing bump electrodes formed on the other surface of the substrate, the plurality of second reinforcing bump electrodes being arranged in locations overlapping the respective first reinforcing bump electrodes;

wherein the first and second reinforcing bump electrodes are disposed outside the periphery of the second semiconductor chip as seen in plan view.

10. The semiconductor device as claimed in claim 9, wherein the thickness of the third semiconductor chip is thicker than the thickness of the first semiconductor chip seen in the lamination direction of the first semiconductor chip and the third semiconductor chip.

11. The semiconductor device as claimed in claim 9, wherein:
   the first through-electrodes and the second bump electrodes of the first semiconductor chip are arranged in locations overlapping the first bump electrodes as seen in plan view; and
   the second through-electrodes and the fourth bump electrodes of the second semiconductor chip are arranged in locations not overlapping the third bump electrodes as seen in plan view.

12. The semiconductor device as claimed in claim 9, wherein the first reinforcing bump electrodes are arranged in a row direction along one side of the first semiconductor chip; and a first spacing between the fourth bump electrodes in the row direction is wider than a second spacing between the third bump electrodes in the row direction.

13. The semiconductor device of claim 12, wherein no third bump electrode is disposed between the fourth bump electrodes and a respective side of the second semiconductor chip as seen in plan view.

14. The semiconductor device of claim 12, wherein the fourth bump electrodes are disposed along opposite sides of the second semiconductor chip, and wherein no third bump electrode is disposed between the fourth bump electrodes and a respective side of the second semiconductor chip as seen in plan view.

15. The semiconductor device of claim 9, further comprising a plurality of reinforcing through-electrodes in the first semiconductor chip, the plurality of reinforcing through-electrodes respectively connecting first reinforcing bump electrodes with second reinforcing bump electrodes.

16. The semiconductor device of claim 9, wherein the first reinforcing bump electrodes are arranged in a row direction along opposite sides of the first semiconductor chip.

\* \* \* \* \*